(12) United States Patent
Wong et al.

(10) Patent No.: US 11,823,939 B2
(45) Date of Patent: Nov. 21, 2023

(54) APPARATUS AND METHODS FOR PROCESSING CHAMBER LID CONCENTRICITY ALIGNMENT

(71) Applicant: Applied Materials, Inc., Santa Clara, CA (US)

(72) Inventors: Kwok Feng Wong, Manteca, CA (US); Rakesh Ramadas, San Jose, CA (US); Ashutosh Agarwal, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 186 days.

(21) Appl. No.: 17/480,985

(22) Filed: Sep. 21, 2021

(65) Prior Publication Data
US 2023/0089089 A1 Mar. 23, 2023

(51) Int. Cl.
*H01L 21/68* (2006.01)
*G01B 11/24* (2006.01)
*H01L 21/687* (2006.01)

(52) U.S. Cl.
CPC ............ *H01L 21/681* (2013.01); *G01B 11/24* (2013.01); *H01L 21/68735* (2013.01)

(58) Field of Classification Search
CPC .. G01B 11/24; H01L 21/681; H01L 21/68735
See application file for complete search history.

(56) References Cited

U.S. PATENT DOCUMENTS

| | | | |
|---|---|---|---|
| 4,853,880 A | 8/1989 | Akamatsu et al. | |
| 4,907,035 A | 3/1990 | Galburt et al. | |
| 5,125,791 A | 6/1992 | Volovich | |
| 5,546,179 A | 8/1996 | Cheng | |
| 6,126,382 A | 10/2000 | Scales et al. | |
| 6,405,101 B1 | 6/2002 | Johanson et al. | |
| 6,631,935 B1 | 10/2003 | Casarotti et al. | |
| 8,033,769 B2 * | 10/2011 | Gage ................. | H01L 21/67196 414/217 |
| 9,597,701 B2 * | 3/2017 | Obweger ............ | B05B 13/0228 |
| 10,319,649 B2 * | 6/2019 | Cho ....................... | G01J 3/0218 |
| 2003/0031549 A1 | 2/2003 | Berger et al. | |
| 2005/0024632 A1 | 2/2005 | Plemmons et al. | |
| 2005/0086024 A1 | 4/2005 | Seeberger, Jr. et al. | |
| 2007/0119370 A1 | 5/2007 | Ma | |

(Continued)

FOREIGN PATENT DOCUMENTS

| | | |
|---|---|---|
| CN | 1759478 B | 4/2006 |
| CN | 101154610 A | 4/2008 |

(Continued)

OTHER PUBLICATIONS

"English Translation of CN101154610A, 7 pages".

(Continued)

*Primary Examiner* — Saul Rodriguez
*Assistant Examiner* — Brendan P Tighe
(74) *Attorney, Agent, or Firm* — Servilla Whitney LLC

(57) ABSTRACT

Methods for aligning a processing chamber using a centering ring and processing chambers having the centering ring are describes. The method includes determining an average central position for the centering ring based on the concentricity of the centering with the support surfaces and adjusting average position of centering ring to a final position based on the average central position.

18 Claims, 8 Drawing Sheets

(56) References Cited

U.S. PATENT DOCUMENTS

2018/0053629 A1    2/2018   Zhang et al.
2020/0013657 A1    1/2020   Lee et al.
2020/0102651 A1    4/2020   Kashyap et al.
2020/0393242 A1   12/2020  Vishwanath et al.

FOREIGN PATENT DOCUMENTS

| KR | 20020087481 A | 11/2002 |
|---|---|---|
| TW | I417928 B | 12/2013 |
| TW | I499688 B | 9/2015 |
| TW | I681852 B | 1/2020 |
| WO | 2009086164 A2 | 7/2009 |
| WO | 2020180607 A1 | 9/2020 |

OTHER PUBLICATIONS

"English Translation of CN1759478B, 15 pages".
"English Translation of KR20020087481A, 7 pages".
"English Translation of TWI417928B, 87 pages".
"English Translation of TWI499688B, 23 pages".
"English Translation of TWI681852B, 16 pages".
PCT International Search Report and Written Opinion in PCT/US2022/044215 dated Jan. 10, 2023, 9 pages.

\* cited by examiner

APPARATUS AND METHODS FOR PROCESSING CHAMBER LID CONCENTRICITY ALIGNMENT

TECHNICAL FIELD

Embodiments of the present disclosure pertain to the calibration and alignment of components of a processing chamber. In particular, embodiments of the disclosure are directed to apparatus and methods for calibrating, aligning and centering one or more showerheads relative to a wafer pedestal at different z-locations.

BACKGROUND

In some chamber designs for atomic layer deposition (ALD) or chemical vapor deposition (CVD) processing, precursors and gases are delivered to a large substrate support or multiple substrate support surfaces through multiple gas distribution plates (or showerheads) at the same time. The gas distribution plates are spaced from wafer pedestals, or vice versa, forming one or more operational gaps. During deposition, materials which spray downward from the showerheads can contaminate and deposit on process kits by flowing through gaps between pedestal supports and walls of the chamber. In some instances, such as processes using metal oxide, the deposition on process kits is not feasibly cleanable and the process kits have to be periodically discarded and replaced, increasing both operating costs and machinery downtime. Proper alignment of the showerhead and the pedestal support can aid in reducing such overspray. In chamber designs which have more than one processing station (and thus more than one showerhead and pedestal support which may rotate between one another), each of the showerheads and the pedestal supports have to also be calibrated Therefore, there is a need in the art for apparatus and methods for calibrating and aligning one or more processing stations of a chamber to reduce overspray of material and unwanted deposition on process kits.

SUMMARY

One or more embodiments of the disclosure are directed to a processing chamber and methods for aligning the processing chamber. In some embodiments, the method comprises positioning a centering ring adjacent an opening in a processing chamber lid so that the centering ring is loosely fixed in position, positioning a vision system on the centering ring, determining a concentricity of the centering ring relative to a first support surface of a substrate support, rotating the substrate support to position a second support surface of the substrate support adjacent to the opening in the processing chamber lid, determining a concentricity of the centering ring relative to the second support surface, determining an average central position for the centering ring based on the concentricity of the centering ring and adjusting the position of the centering ring to a final position based on the average central position. In some embodiments, the processing chamber lid has an outside surface and an inside surface. In some embodiments, the centering ring is positioned in contact with the outside surface and having an inner diameter and an outer diameter. In some embodiments, the opening in the processing chamber lid has an opening diameter. In some embodiments, the substrate support is positioned adjacent to and spaced from the inside surface of the processing chamber lid using the vision system. In some embodiments, the average central position for the centering ring is based on the concentricity of the centering ring with the first support surface and the second support surface.

In some embodiments, the method further comprises rotating the substrate support to position a third support surface of the substrate support adjacent to the opening in the processing chamber lid, determining a concentricity of the centering ring relative to the third support surface, rotating the substrate support to position a fourth support surface of the substrate support adjacent to the opening in the processing chamber lid, and determining a concentricity of the centering ring relative to the fourth support surface. In some embodiments, the average central position for the centering ring is based on the concentricity of the centering ring with the first support surface, the second support surface, the third support surface and the fourth support surface.

In some embodiments, the processing chamber comprises an interior volume defined by a processing chamber lid having an opening and a housing having walls and a bottom, a plurality of processing stations comprising a substrate support with a support surface located within the interior volume, a gas distribution assembly configured to deliver gas on the support surface through the opening, and a centering ring positioned at an average central position of the centering ring relative to the support surface and adjacent to the opening. In some embodiments, the centering ring has an inner diameter less than or equal to the outer diameter of the opening in the processing chamber lid, and the gas distribution assembly and the centering ring forms a seal with the processing chamber lid on the opening.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Figure 1:
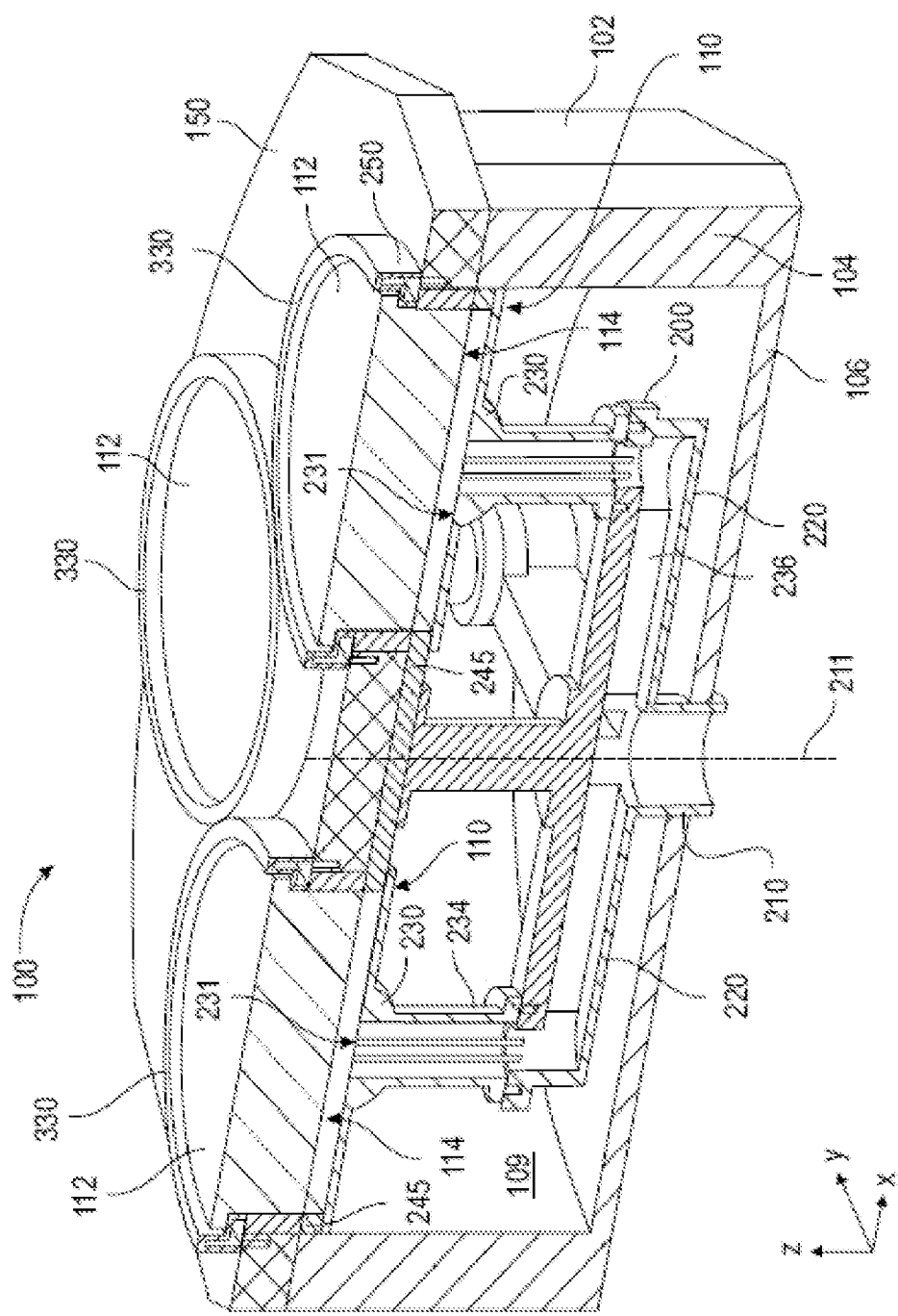
FIG. 1 illustrates a cross-sectional isometric view of a processing chamber in accordance with one or more embodiments of the present disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" and "wafer" are used interchangeably, both referring to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor substrates. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus for example, where a film/layer or partial film/layer has been deposited onto a substrate surface, the exposed surface of the newly deposited film/layer becomes the substrate surface.

As used in this specification and the appended claims, the terms "precursor", "reactant", "reactive gas" and the like are used interchangeably to refer to any gaseous species that can react with the substrate surface, or with a film formed on the substrate surface.

"Atomic layer deposition" or "cyclical deposition" as used herein refers to the sequential exposure of two or more reactive compounds to deposit a layer of material on a substrate surface. The substrate, or portion of the substrate, is exposed sequentially or separately to the two or more reactive compounds which are introduced into a reaction zone of a processing chamber. In a time-domain ALD process, exposure to each reactive compound is separated by a time delay to allow each compound to adhere and/or react on the substrate surface and then be purged from the processing chamber. These reactive compounds are said to be exposed to the substrate sequentially.

In a spatial ALD process, different portions of the substrate surface, or material on the substrate surface, are exposed simultaneously to the two or more reactive compounds so that any given point on the substrate is substantially not exposed to more than one reactive compound simultaneously. As used in this specification and the appended claims, the term "substantially" used in this respect means, as will be understood by those skilled in the art, that there is the possibility that a small portion of the substrate may be exposed to multiple reactive gases simultaneously due to diffusion, and that the simultaneous exposure is unintended.

In one aspect of a time-domain ALD process, a first reactive gas (i.e., a first precursor or compound A) is pulsed into the reaction zone followed by a first time delay. Next, a second reactive gas (i.e., a second precursor or compound B) is pulsed into the reaction zone followed by a second delay. During each time delay, a purge gas, such as argon, may be introduced into the processing chamber to purge the reaction zone or otherwise remove any residual reactive compound or reaction by-products from the reaction zone. Alternatively, the purge gas may flow continuously throughout the deposition process so that only the purge gas flows during the time delay between pulses of reactive compounds. The reactive compounds are alternatively pulsed until a desired film or film thickness is formed on the substrate surface. In either scenario, the ALD process of pulsing compound A, purge gas, compound B, and purge gas is a cycle. A cycle can start with either compound A or compound B and continue the respective order of the cycle until achieving a film with the predetermined thickness.

A "pulse" or "dose" as used herein is intended to refer to a quantity of a source gas that is intermittently or non-continuously introduced into the processing chamber. The quantity of a particular compound within each pulse may vary over time, depending on the duration of the pulse. A particular process gas may include a single compound or a mixture/combination of two or more compounds, for example, the process gases described below.

The disclosure provides embodiments of a processing chamber. In one or more embodiments, the processing chamber comprises a chamber body having sidewalls and a bottom bounding a process volume. In one or more embodiments, the processing chamber comprises a substrate support having a rotational axis within the process volume. In one or more embodiments, the substrate support comprises a plurality of movable heaters positioned a distance from the rotational axis and arranged symmetrically around the rotational axis.

Figure 2:
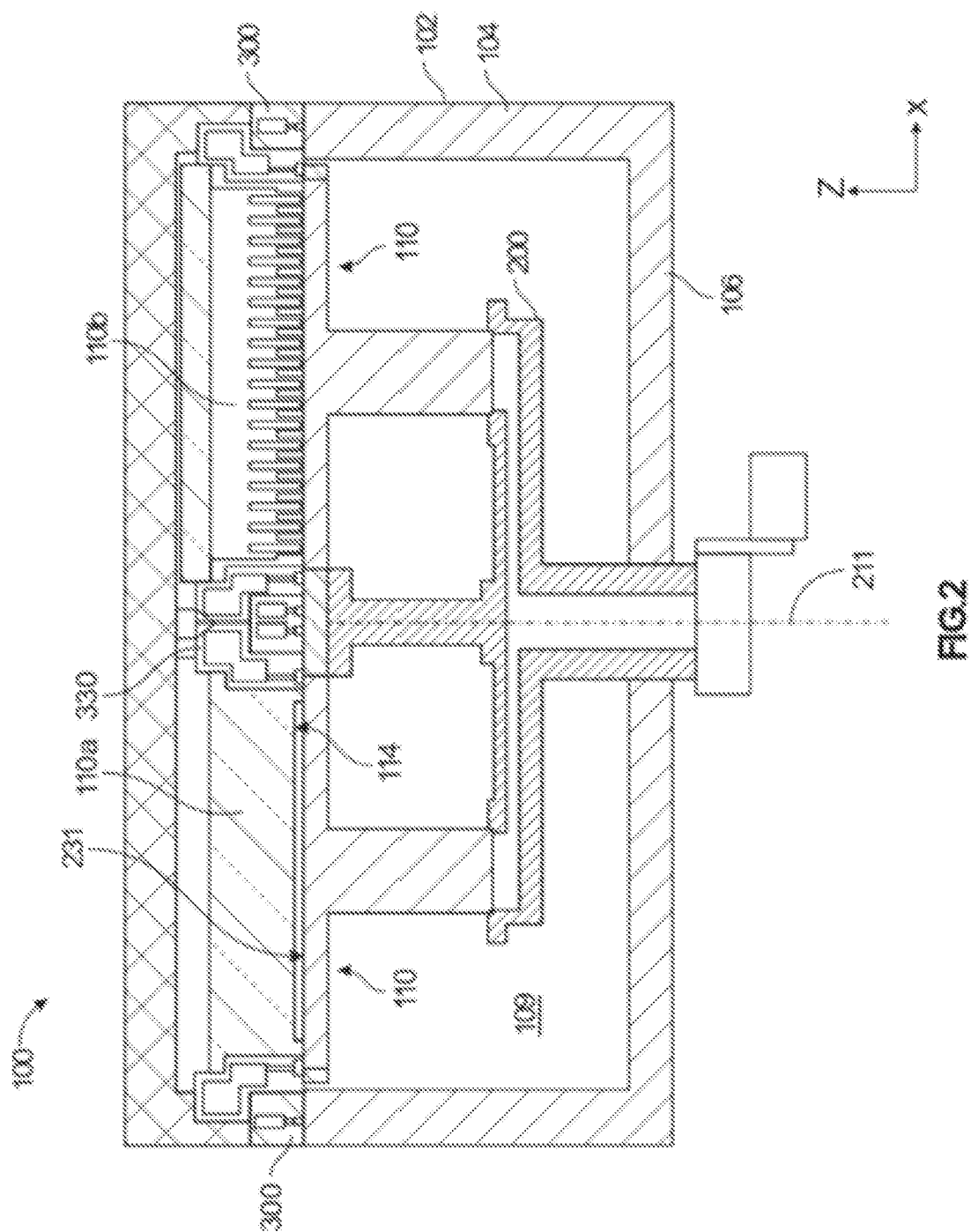
FIG. 2 shows a cross-sectional view of a processing chamber in accordance with one or more embodiments of the disclosure.

The disclosure provides methods for use with single wafer or multi-wafer (also referred to as batch) processing chambers. FIGS. 1 and 2 illustrate a processing chamber 100 in accordance with one or more embodiment of the disclosure. FIG. 1 shows the processing chamber 100 illustrated as a cross-sectional isometric view in accordance with one or more embodiment of the disclosure. FIG. 2 shows a processing chamber 100 in cross-section according to one or more embodiment of the disclosure. Accordingly, some embodiments of the disclosure are directed to processing chambers 100 that incorporate a substrate support assembly 200. The term "assembly" refers to a combination of components or parts.

The processing chamber 100 has a housing 102 with walls 104 and a bottom 106. The housing 102 along with the processing chamber lid 300 define a processing volume 109, also referred to as an interior volume.

The processing chamber 100 illustrated includes a plurality of processing stations 110. The processing stations 110 are located in the interior volume 109 of the housing 102 and are positioned in a circular arrangement around the rotational axis 211 of the substrate support assembly 200. Each processing station 110 comprises a gas distribution plate 112 having a front surface 114. In some embodiments, the front surfaces 114 of each of the gas distribution plate 112 are substantially coplanar. The processing stations 110 are defined as a region in which processing can occur. For example, in some embodiments, a processing station 110 is defined as a region bounded by the support surface 231 of a substrate support 225, as described below, and the front surface 114 of the gas distribution plate 112. In some embodiments, the gas distribution plate 112 comprises one or more of a spacer, a gas funnel, a gas injector or showerhead. In some embodiments, the processing chamber 100 comprises more than one support surfaces 231. In some embodiments, the processing chamber 100 comprises a plurality of support surfaces 231. In the illustrated embodiment, heaters 230 act as the support surfaces 231 and form part of the substrate support 225.

The substrate support assembly 200 comprises a support arm 220. In some embodiments, the processing chamber comprises one, two, three, four, five, six, seven or eight support arms 220. In some embodiments, the processing chamber 100 comprises more than eight support arms 220. In some embodiments, number of the support arm 220 are equal to number of the processing station 110.

The substrate support assembly 200 comprises a support shaft 234. In some embodiments, a support shaft 234 is located at the outer end of each of the support arms 220. The center of the support surfaces 231 are located at a distance from the rotational axis 211 so that upon rotation of the center base 210 the support surfaces 231 move in a circular path offset from the rotational axis. In some embodiments, the processing chamber comprises one, two, three, four, five, six, seven or eight support shafts 234. In some embodiments, the processing chamber 100 comprises more than eight support shafts 234. In some embodiments, number of the support shaft 234 are equal to a number of the processing station 110.

The processing chambers 100 described herein have plurality of processing stations 110. In some embodiments, the processing chamber has two, three, four, five, six, seven or eight procession stations 110. In some embodiments, each of the plurality of processing stations 110 are spatially separated processing environments. In some embodiments, the processing chamber 100 has more than eight processing stations 110. The processing environments can be mounted with sealing surfaces that are coplanar and parallel to the substrate(s).

The process environments can be placed in a circular arrangement. In some embodiments, two, three, four, five, six, seven or eight substrate support 225. In some embodiments, each of the plurality of substrate support 225 have spatially separated processing environments. In some embodiments, the processing chamber 100 has more than eight substrate support 225. A rotatable structure with one to four (or more) individual substrate support 225 mounted thereon moves the substrates in a circular path with a diameter sufficient to align substrate support 225 with the process environments. In some embodiments, each of the substrate support 225 is operatively connected with heater 230. Each heater 230 may be temperature controlled and may have one or multiple concentric temperature control zones.

The processing stations 110 can be configured to perform any suitable process and provide any suitable process conditions. The type of gas distribution plate 112 used will depend on, for example, the type of process being performed and the type of showerhead or gas injector. For example, a processing station 110 configured to operate as an atomic layer deposition (ALD) apparatus may have a showerhead or vortex type gas injector, whereas a processing station 110 configured to operate as a plasma station may have one or more electrode and/or grounded plate configuration to generate a plasma while allowing a plasma gas to flow toward the wafer. The embodiment illustrated in FIG. 2 has a different type of processing station 110 on the left side (processing station 110a) of the drawing than on the right side (processing station 110b) of the drawing. Suitable processing stations 110 include, but are not limited to, thermal processing stations, microwave plasma, three-electrode CCP, ICP, parallel plate CCP, UV exposure, laser processing, pumping chambers, annealing stations and metrology stations.

Figure 3:
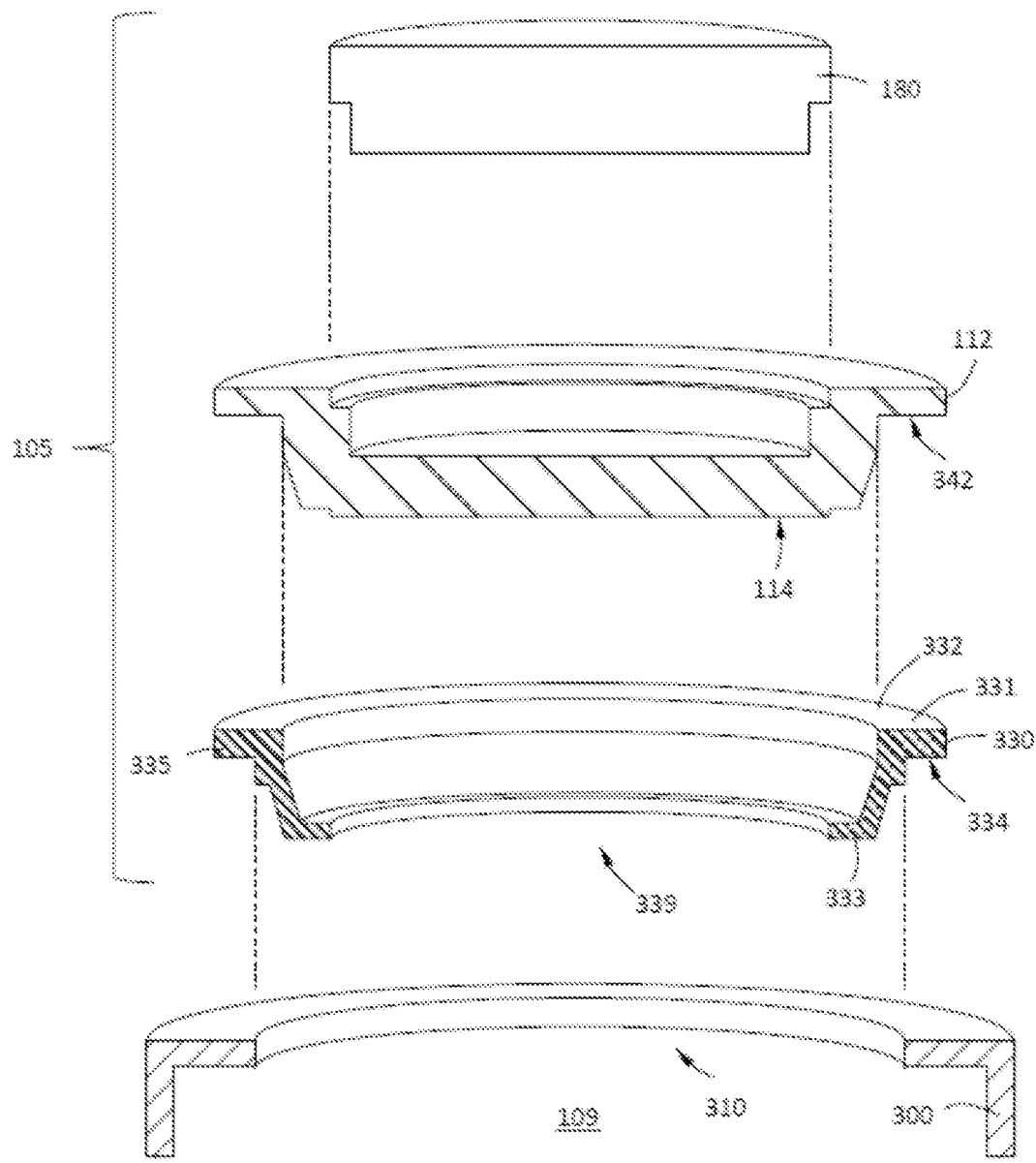
FIG. 3 shows a cross-sectional view of a portion of a processing chamber in accordance with one or more embodiment of the disclosure.

FIG. 3 illustrates an enlarged view of a gas distribution assembly 105 for use in a processing station 110 or a processing chamber in accordance with one or more embodiment of the disclosure. The skilled artisan will recognize that embodiment illustrated in FIG. 3 is a general schematic and omits details (e.g., gas channels). The gas distribution assembly 105 illustrated comprises three main components: a gas distribution plate 112, a lid 180 and an optional spacer 330. The spacer 330 is also referred to as a pump/purge spacer, insert or pump/purge insert. In some embodiments, the spacer 330 is connected to or in fluid communication with a vacuum (exhaust). In some embodiments, the spacer 330 is connected to or in fluid communication with a purge gas source.

The plurality of station openings 310 in the processing chamber lid 300 can be uniformly sized or have different sizes. The processing chamber lid 300 has an outside surface 325 and inside surface 326. The inside surface 326 faces an opening 310. The opening 310 has an opening diameter allowing the gas distribution assembly 105 operatively deliver gas to the substrate positioned on the support surface 231. Different sized/shape gas injectors can be used with a pump/purge spacer 330 that is suitably shaped to transition from the plurality of station openings 310 to the gas distribution plate 112. For example, as illustrated, the pump/purge spacer 330 includes a top 331 and bottom 333 with a sidewall 335. When inserted into the plurality of openings 310 in the processing chamber lid 300, a ledge 334 is configured to be positioned in the plurality of openings 310. In some embodiments, the gas distribution assembly 105 is configured to deliver gas on the support surface 231 through the opening 310.

The pump/purge spacer 330 includes an opening 339 in which a gas distribution plate 112 can be inserted. The gas distribution plate 112 illustrated has a flange 342 which can be in contact with the ledge formed by the back surface 332 adjacent the top 331 of the pump/purge spacer 330. The diameter or width of the gas distribution plate 112 can be any suitable size that can fit within the opening 339 of the pump/purge spacer 330. This allows gas distribution plate 112 of various types to be used within the same opening 310 in the processing chamber lid 300.

Figure 4:
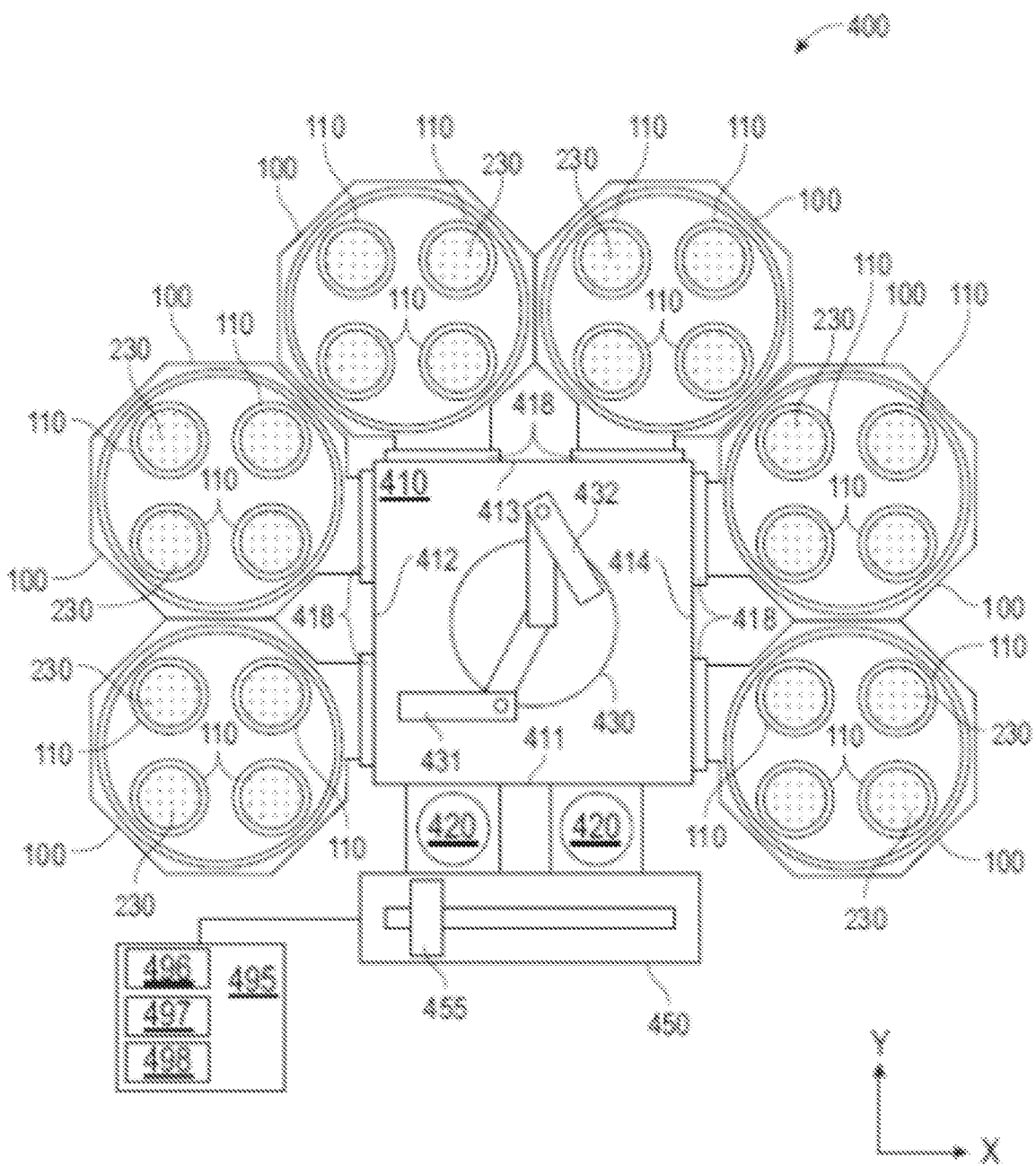
FIG. 4 shows a schematic representation of a processing tool in accordance with one or more embodiment of the disclosure.

FIG. 4 shows a processing platform 400 in accordance with one or more embodiment of the disclosure. The embodiment shown in FIG. 4 is merely representative of one possible configuration and should not be taken as limiting the scope of the disclosure. For example, in some embodiments, the processing platform 400 has a different number of one or more of the processing chambers 100, buffer stations 420 and/or robot 430 configurations than the illustrated embodiment.

The exemplary processing platform 400 includes a central transfer station 410 which has a plurality of sides 411, 412, 413, 414. The transfer station 410 shown has a first side 411, a second side 412, a third side 413 and a fourth side 414. Although four sides are shown, those skilled in the art will understand that there can be any suitable number of sides to the transfer station 410 depending on, for example, the overall configuration of the processing platform 400. In some embodiments, there the transfer station 410 has three sides, four sides, five sides, six sides, seven sides or eight sides.

The transfer station 410 has a robot 430 positioned therein. The robot 430 can be any suitable robot capable of moving a wafer during processing. In some embodiments, the robot 430 has a first arm 431 and a second arm 432. The first arm 431 and second arm 432 can be moved independently of the other arm. The first arm 431 and second arm 432 can move in the x-y plane and/or along the z-axis. In some embodiments, the robot 430 includes a third arm (not shown) or a fourth arm (not shown). Each of the arms can move independently of other arms.

The embodiment illustrated includes six processing chambers 100 with two connected to each of the second side 412, third side 413 and fourth side 414 of the central transfer station 410. Each of the processing chambers 100 can be configured to perform different processes.

The processing platform 400 can also include one or more buffer station 420 connected to the first side 411 of the central transfer station 410. The buffer stations 420 can perform the same or different functions. For example, the buffer stations may hold a cassette of wafers which are processed and returned to the original cassette, or one of the buffer stations may hold unprocessed wafers which are moved to the other buffer station after processing. In some embodiments, one or more of the buffer stations are configured to pre-treat, pre-heat or clean the wafers before and/or after processing.

The processing platform 400 may also include one or more slit valves 418 between the central transfer station 410 and any of the processing chambers 100. The slit valves 418 can open and close to isolate the interior volume within the processing chamber 100 from the environment within the central transfer station 410. For example, if the processing chamber will generate plasma during processing, it may be helpful to close the slit valve for that processing chamber to prevent stray plasma from damaging the robot in the transfer station.

The processing platform 400 can be connected to a factory interface 450 to allow wafers or cassettes of wafers to be loaded into the processing platform 400. A robot 455 within the factory interface 450 can be used to move the wafers or cassettes into and out of the buffer stations. The wafers or cassettes can be moved within the processing platform 400 by the robot 430 in the central transfer station 410. In some embodiments, the factory interface 450 is a transfer station of another cluster tool (i.e., another multiple chamber processing platform).

A controller 495 may be provided and coupled to various components of the processing platform 400 to control the operation thereof. The controller 495 can be a single controller that controls the entire processing platform 400, or multiple controllers that control individual portions of the processing platform 400. For example, the processing platform 400 of some embodiments comprises separate controllers for one or more of the individual processing chambers 100, central transfer station 410, factory interface 450 and/or robots 430.

In some embodiments, the processing chamber 100 further comprises a controller 495 connected to the plurality of substantially coplanar support surfaces 231 configured to control one or more of the first temperature or the second temperature. In one or more embodiments, the controller 495 controls a movement speed of the substrate support assembly 200 (FIG. 2).

In some embodiments, the controller 495 includes a central processing unit (CPU) 496, a memory 497, and support circuits 498. The controller 495 may control the processing platform 400 directly, or via computers (or controllers) associated with particular processing chamber and/or support system components.

The controller 495 may be one of any form of general-purpose computer processor that can be used in an industrial setting for controlling various chambers and sub-processors. The memory 497 or computer readable medium of the controller 495 may be one or more of readily available memory such as random access memory (RAM), read only memory (ROM), floppy disk, hard disk, optical storage media (e.g., compact disc or digital video disc), flash drive, or any other form of digital storage, local or remote. The memory 497 can retain an instruction set that is operable by the processor (CPU 496) to control parameters and components of the processing platform 400.

The support circuits 498 are coupled to the CPU 496 for supporting the processor in a conventional manner. These circuits include cache, power supplies, clock circuits, input/output circuitry and subsystems, and the like. One or more processes may be stored in the memory 498 as software routine that, when executed or invoked by the processor, causes the processor to control the operation of the processing platform 400 or individual processing chambers in the manner described herein. The software routine may also be stored and/or executed by a second CPU (not shown) that is remotely located from the hardware being controlled by the CPU 496.

Some or all of the processes and methods of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general-purpose computer into a specific purpose computer (controller) that controls the chamber operation such that the processes are performed.

In some embodiments, the controller 495 has one or more configurations to execute individual processes or sub-processes to perform the method. The controller 495 can be connected to and configured to operate intermediate components to perform the functions of the methods. For example, the controller 495 can be connected to and configured to control one or more of gas valves, actuators, motors, slit valves, vacuum control or other components.

The durations for each pulse/dose are variable and may be adjusted to accommodate, for example, the volume capacity of the processing chamber as well as the capabilities of a vacuum system coupled thereto. Additionally, the dose time of a process gas may vary according to the flow rate of the process gas, the temperature of the process gas, the type of control valve, the type of processing chamber employed, as well as the ability of the components of the process gas to adsorb onto the substrate surface. Dose times may also vary based upon the type of layer being formed and the geometry of the device being formed. A dose time should be long enough to provide a volume of compound sufficient to adsorb/chemisorb onto substantially the entire surface of the substrate and form a layer of a process gas component thereon.

Some embodiments of the disclosure are directed to film deposition processes using a batch processing chamber, also referred to as a spatial processing chamber. In one or more embodiments, the batch processing chamber may be any batch processing chamber known to one of skill in the art.

During deposition, misalignment between the gas distribution assembly 105 and the processing chamber lid 300 may contaminate and deposit around the support surface 231 and on to the process kits. In some instances, process kits can be cleaned during maintenance of the chamber. However, certain precursors such as metal oxides are not feasibly or practically cleanable. Therefore, proper alignment of the gas distribution assembly 105 and the processing chamber lid 300 advantageously reduces downtime and operating costs of the chambers. Accordingly, one or more embodiments of the present disclosure are directed to an apparatus, methods and systems for aligning the gas distribution assembly 105 and the processing chamber lid 300.

Figure 5:
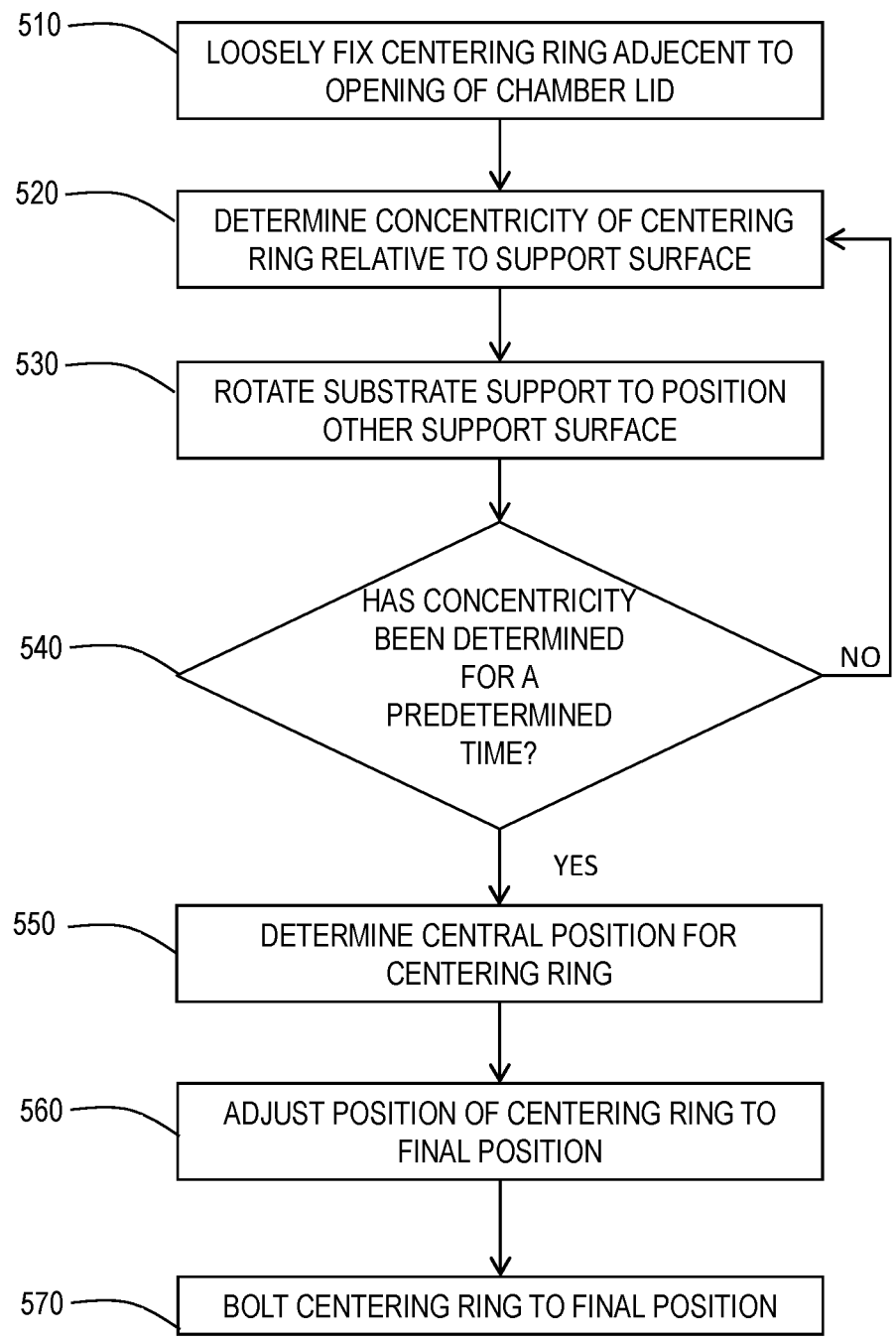
FIG. 5 shows a processing method in accordance with one or more embodiment of the disclosure.

FIG. 5 describes method 500 for aligning the gas distribution assembly 105 and the processing chamber lid 300 according to one or more embodiments of the disclosure. In one or more embodiments, the method 500 uses a centering ring for aligning the gas distribution assembly 105 and the processing chamber lid 300. At operation 510, the centering ring is positioned adjacent the opening 310 of the processing chamber lid 300. The centering ring may be loosely fixed. In some embodiments, the centering ring has a sufficient tolerance gap to allow for adjustment of the centering ring relative to the support surface 231.

Figure 6:
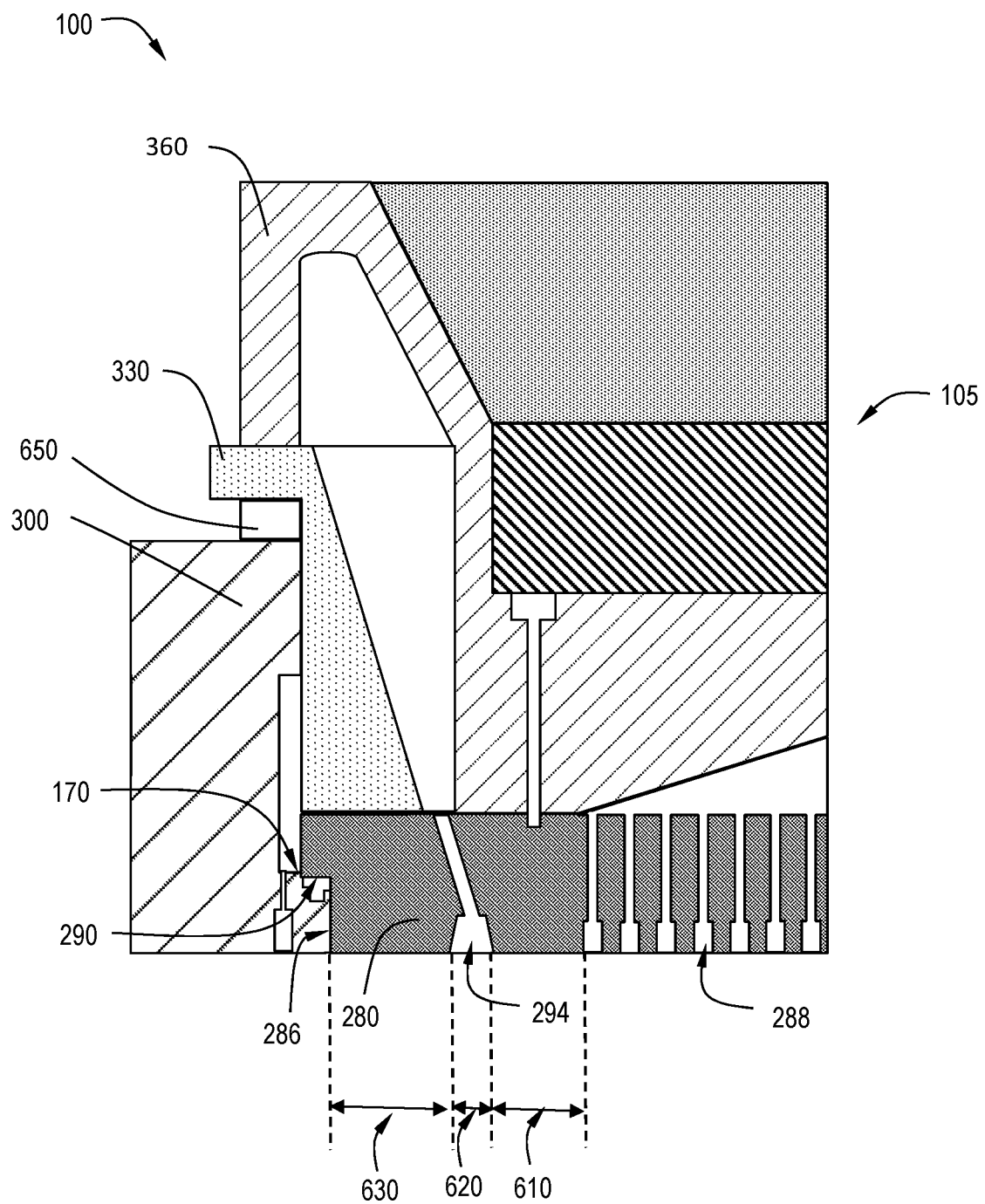
FIG. 6 shows a cross-sectional view of a portion of a processing chamber in accordance with one or more embodiment of the disclosure.

FIG. 6 illustrates the centering ring 650 between the processing chamber lid 300 and the gas distribution plate 112, wherein the gas distribution plate 112 comprises a gas funnel 360, a spacer 330 and showerhead 280. In some embodiments, the spacer 330 is optional. As shown, the showerhead 280 is positioned under and in contact with the spacer 250. The showerhead 280 comprises a plurality of apertures 288 extending through the showerhead 280 towards an outer edge 286 of the showerhead 280. The showerhead 280 further comprises at least one exhaust port 294 positioned between the plurality of apertures 288 and the outer edge 286. The plurality of apertures 288 are configured to direct gasses on the support surface 231. The exhaust port 294 is configured to withdraw excess gasses from the deposition process.

As shown in FIG. 6, the region from the outermost plurality of apertures 288 to the at least one exhaust port 294 is defined as a full deposition zone FD 610 in which precursor is still being fully flowed and ejected from the plurality of apertures 288. The region between the width of the at least one exhaust port 294 is defined as a transition region TD 620 in which deposition begins to fall off due to exhausting from the at least one exhaust port 294. The region from the at least one exhaust port 294 to the outer peripheral edge 286 is defined as a no-deposition zone ND 630 in which no precursor material is present. The stated zones generally align to precursor dilution zones and in some embodiments a sharp film deposition transition aligns to the outer diameter of the at least one exhaust port 294. Non-concentricity of the gas distribution plate 112 relative to the support surface 231 can be, in some embodiments, ±1.5 mm (RMS) due to tolerance stackup. Non-concentricity and misalignment can cause one or more of the regions FD 610, TD 620, ND 630 to shift and cause overspray of deposition into adjacent zones.

In some embodiments, the outer peripheral edge 286 of the showerhead 280 has a lip 290 configured to seat the showerhead 280 within a ledge 170 of the chamber lid 300. A tolerance gap is created between the showerhead 280 and the chamber lid 300 at the ledge 170 and lip 290. The tolerance gap allows for positioning and adjustment of the centering ring 650.

In some embodiments, the gas distribution assembly 105 and the centering ring 650 forms a seal with the processing chamber lid 300 on the opening 310, forming a processing station 110 of the processing chamber 100. One or more embodiments are further directed to systems and methods for calibrating multiple processing stations 110 by using only one vision system 700.

In the embodiments described herein, a particular chamber architecture is described for reference, however it is understood that the vision system 700 and calibration methods and systems can be used on any chamber or chamber architecture in which the gas distribution assemblies 105 can be dropped into or otherwise removably or non-removably attached to the chamber lid 300.

Figure 7A:
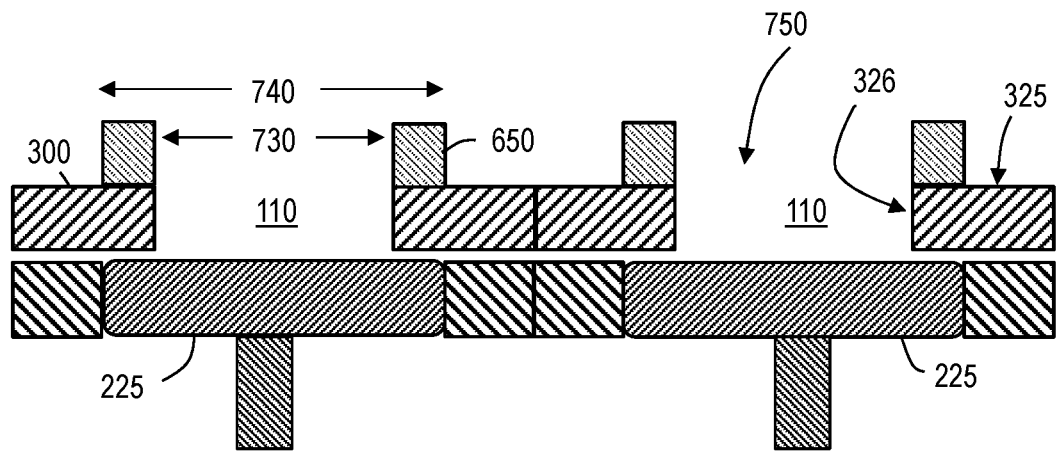
FIGS. 7A through 7C illustrates a schematic representation of a processing chamber during alignment in accordance with one or more embodiment of the disclosure.
Figure 7B:
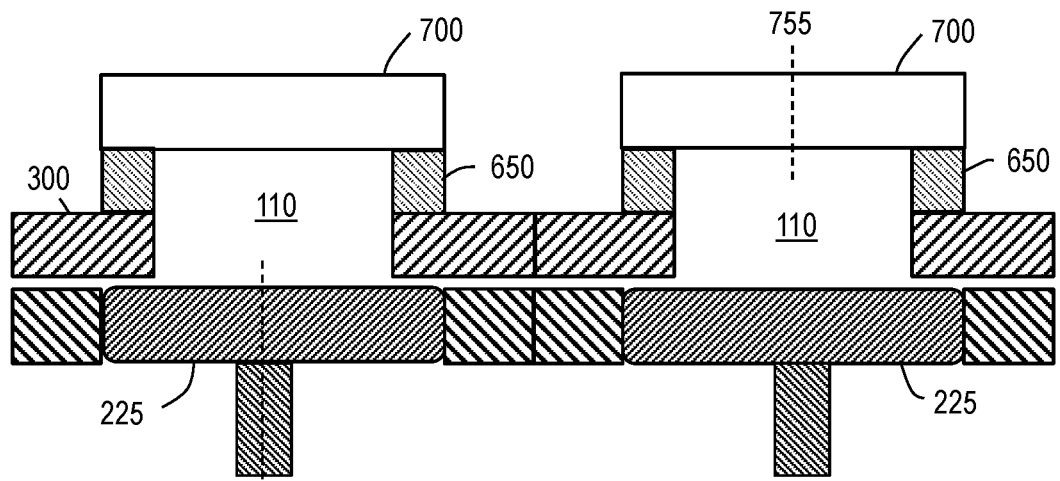
Figure 7C:
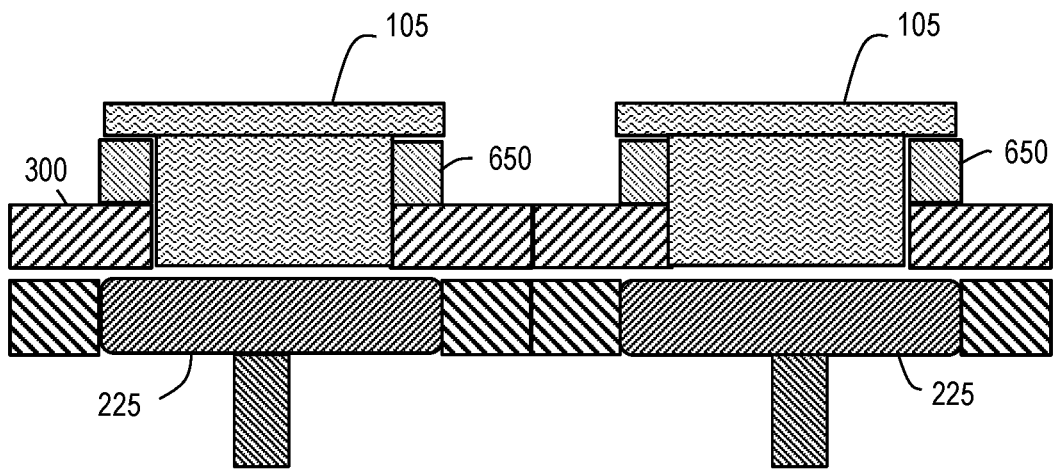

FIGS. 7A through 7C illustrate schematic representations of method 500. FIG. 7A illustrating cross-sectional views of two processing stations 110, processing chamber lid 300 with openings 310, substrate supports 225 with support surfaces 231 and centering rings 650. In some embodiments, the centering ring 650 further comprises one or more tabs extending outwardly from the ring-like body. In some embodiments, each of the one or more tabs has an aperture for receiving a bolt to secure the centering ring 650 against the chamber lid 300. As shown, the centering rings 650 are positioned adjacent to the opening 310 and adjacent to the outer surface 325. The centering rings 650 have an inner diameter 730 and an outer diameter 740. The centering rings 650 have an opening 750 equal to a size of the inner diameter 730. In some embodiments, the inner diameter 730 of the centering ring 650 is smaller or equal to a diameter of the opening 310. In some embodiments the inner diameter 730 of the centering ring 650 is smaller or equal to a diameter of the opening 310 in a range of from 50 mm to 0 mm, from 40 mm to 0 mm, from 30 mm to 0 mm, from 20 mm to 0 mm, from 10 mm to 0 mm, from 50 mm to 10 mm, from 40 mm to 10 mm, from 30 mm to 10 mm, from 20 mm to 10 mm, from 50 mm to 20 mm, from 40 mm to 20 mm, from 30 mm to 20 mm, from 50 mm to 30 mm, from 40 mm to 30 mm or from 50 mm to 40 mm. In some embodiments, the outer diameter 740 of the centering ring 650 is larger or equal to a diameter of the opening 310. In some embodiments the outer diameter 740 of the centering ring 650 is larger or equal to a diameter of the opening 310 in a range of from 50 mm to 0 mm, from 40 mm to 0 mm, from 30 mm to 0 mm, from 20 mm to 0 mm, from 10 mm to 0 mm, from 50 mm to 10 mm, from 40 mm to 10 mm, from 30 mm to 10 mm, from 20 mm to 10 mm, from 50 mm to 20 mm, from 40 mm to 20 mm, from 30 mm to 20 mm, from 50 mm to 30 mm, from 40 mm to 30 mm or from 50 mm to 40 mm.

Referring back to FIG. 5, at operation 520, a concentricity of the centering ring 650 relative to the support surface 231 is determined. FIG. 7B illustrates a vision system 700 positioned on the centering rings 650. In some embodiments, the vision system 700 is configured to determine concentricity of the centering ring 650 relative to the support surface 231 that is positioned adjacent to and spaced from the inside surface 326 of the processing chamber lid 300. In one or more embodiments, the vision system 700 is a laser profilometer. In one or more embodiments, the vision system 700 is removably mounted on to the opening 310 of the processing chamber lid 300. In some embodiments, the vision system 700 comprises a support structure which clamps onto or around the opening 310. In some embodiments, the vision system 700 is configured to measure misalignment between a center axis 755 of the gas distribution assembly 105 relative to the center axis 760 of the support surface 231. In some embodiments, the misalignment is in a range of from 50 mm to 0 mm, from 40 mm to 0 mm, from 30 mm to 0 mm, from 20 mm to 0 mm, from 10 mm to 0 mm, from 50 mm to 10 mm, from 40 mm to 10 mm, from 30 mm to 10 mm, from 20 mm to 10 mm, from 50 mm to 20 mm, from 40 mm to 20 mm, from 30 mm to 20 mm, from 50 mm to 30 mm, from 40 mm to 30 mm or from 50 mm to 40 mm. In some embodiments, the misalignment is recorded as theta position of the centering ring 650 and the support surface 231. In some embodiments, the vision system 700 is connected to the centering ring 650 during measurement.

Figure 8:
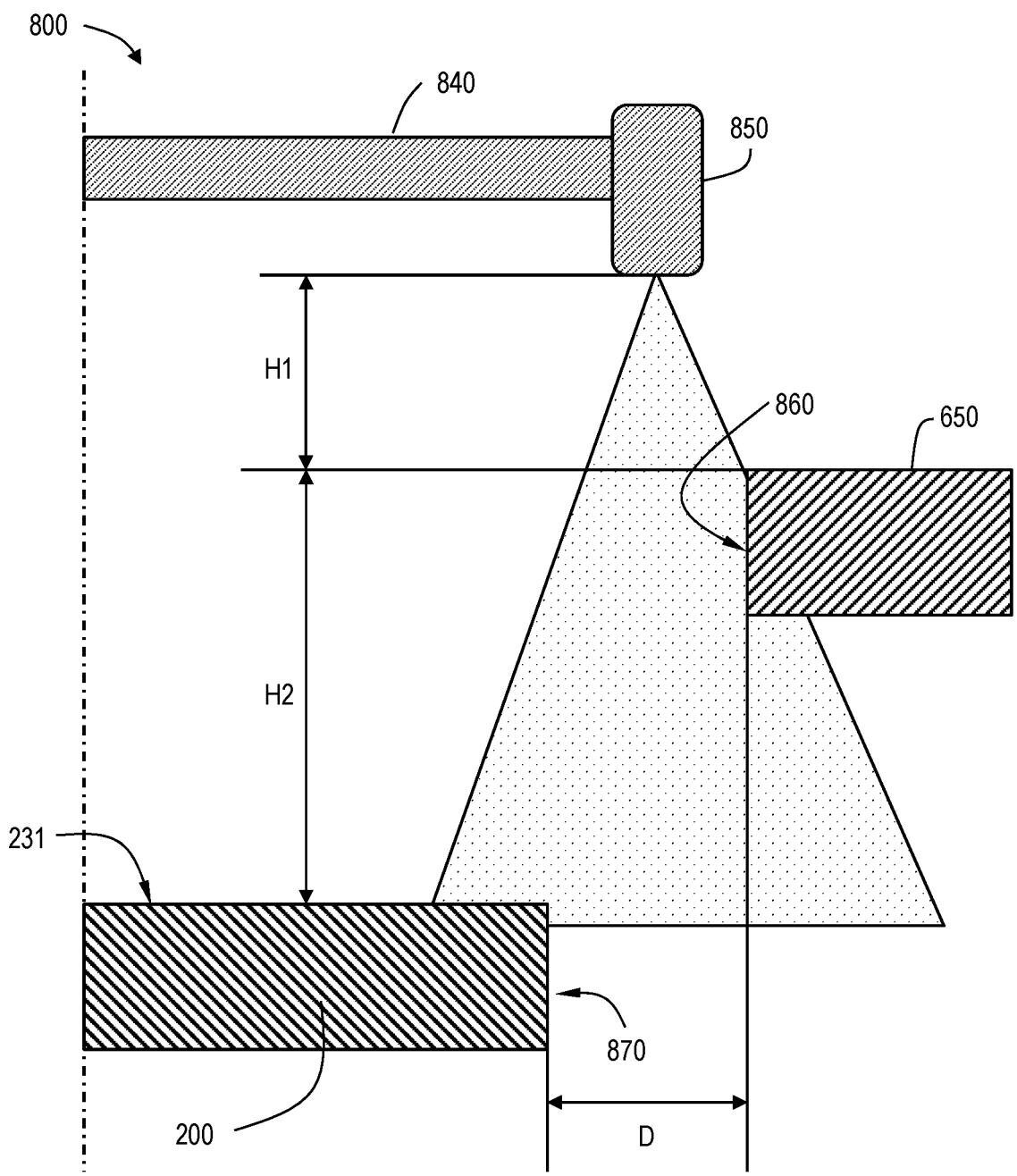
FIG. 8 illustrates a schematic representation of a sensor apparatus in accordance with one or more embodiment of the disclosure.

FIG. 8 illustrates functioning of the vision apparatus 700. In some embodiments, the vision apparatus 700 comprises a ring structure that positions the vison apparatus 700 over the opening 310. In some embodiments, the vision apparatus 700 comprises a rotary motor having a rotary arm 840. In some embodiments, the rotary arm 840 rotates on an xy stage to obtain measurements at different angular positions. In some embodiments, the rotary arm 840 is connected to a profile sensor 850. In some embodiments, the profile sensor 850 is directed to the edges of the substrate support 225 and centering ring 650. In some embodiments, the profiler sensor 850 is configured to detect the relative gap between an inner edge 860 of the centering ring 650 and an outer edge 870 of the substrate support 225 having the support surface 231. In some embodiments, the gap value is charted in reference to theta position of the centering ring 650 and substrate support 225. In some embodiments, the gap value refers to a distance between the inner edge 860 of the centering ring 650 and the outer edge 870 of the substrate support 225 as if both are in same horizontal plane. In some embodiments, the gap value is in a range of from 50 mm to 0 mm, from 40 mm to 0 mm, from 30 mm to 0 mm, from 20 mm to 0 mm, from 10 mm to 0 mm, from 50 mm to 10 mm, from 40 mm to 10 mm, from 30 mm to 10 mm, from 20 mm to 10 mm, from 50 mm to 20 mm, from 40 mm to 20 mm, from 30 mm to 20 mm, from 50 mm to 30 mm, from 40 mm to 30 mm or from 50 mm to 40 mm.

Referring back to FIG. 5, at operation 530, the substrate support 225 is rotated to be replace with other substrate support 225. The rotation positions the other substrate support 225 having support surface 231 adjacent to the opening 310. At decision 540, number of times determination of the concentricity of the centering ring 650 relative to the support surface 231 is considered. If the concentricity has been determined for a predetermined time, the method 500 moves to operation 550. If the concentricity has not been determined for the predetermined time, the method 500 moves back to operation 520. In some embodiments, the predetermined time is equal to the number of support surfaces 231. In some embodiments, the predetermined time is equal to multiples of the number of support surfaces 231. In some embodiments, the processing chamber 100 has two, three or four support surfaces 231 on the substrate support 225. In some embodiments, the concentricity of the centering ring 650 relative to first, second, third and fourth support surfaces 231 is determined. In some embodiments, the concentricity of the centering ring 650 relative to first, second, third and fourth support surfaces 231 is determined multiple times. In some embodiments, the concentricity is determined one, two, three, four or multiple thereof times.

At operation 550, average central position for centering ring 650 is determined based on all concentricity determined at operation 520. In some embodiments, the average central position of the centering ring 650 refers to average central position of the centering ring 650 relative to first, second, third and fourth support surfaces 231. In some embodiments, the average central position is determined based on a mathematical model. In some embodiments, the mathematical model comprises a $5^{th}$ order polynomial regression model. In some embodiments, the mathematical model is configured to determine extema at specific theta position. In some embodiments, the mathematical model includes thermal expansion offset. In some embodiments, the specific theta position is such that the misalignment remains below a predetermined threshold. The predetermined threshold is in a range of from 50 mm to 0 mm, from 40 mm to 0 mm, from 30 mm to 0 mm, from 20 mm to 0 mm, from 10 mm to 0 mm, from 50 mm to 10 mm, from 40 mm to 10 mm, from 30 mm to 10 mm, from 20 mm to 10 mm, from 50 mm to 20 mm, from 40 mm to 20 mm, from 30 mm to 20 mm, from 50 mm to 30 mm, from 40 mm to 30 mm or from 50 mm to 40 mm misalignment of center axis of the gas distribution assembly 152 relative to the center axis 153 of the support surface 231.

At operation 560, a position of the centering ring 650 is adjusted based on the average central position determined at operation 550. In some embodiments, the average central position is function of the theta position. In some embodiments, the desired theta position is charted based on various parameters. In some embodiments, the various parameters include but are not limited to vertical distance of the centering ring 650 from the support surface 231, size of the opening 310, size of the centering ring 650. In some embodiments, the support structure clamped onto the centering ring 650 calibrates the centering ring 650 relative to the support surface 231. In some embodiments, the automated device is operatively connected to one or more of the vision system 700 and the centering ring 650. In some embodiments, the automated device is configured to move the centering ring 650 to a desired theta position.

At operation 570, the centering ring 650 is bolted to the desired theta position. In some embodiments, the desired theta position is the final position. In some embodiments, following the method 500, the vision system 700 is removed and the process station 110 is installed in the opening 310 through the centering ring 650. FIG. 7C illustrates the gas distribution assemblies 105 positioned over the centering rings 650. In some embodiments, the processing station 110 has an outer diameter is less or equal to the inner diameter 730 of the centering ring 650. In some embodiments, the processing station 110 has an outer diameter in a range of from 1 mm to 10 mm, from 1 mm to 8 mm, from 1 mm to 6 mm, from 1 mm to 4 mm, from 1 mm to 5 mm, from 1 mm to 2 mm, from 3 mm to 10 mm, from 3 mm to 8 mm, from 3 mm to 6 mm, from 3 mm to 4 mm, from 5 mm to 10 mm, from 5 mm to 8 mm, from 5 mm to 6 mm, from 7 mm to 10 mm or from 7 mm to 9 mm smaller than the processing chamber lid opening 310. In some embodiments, the substrate support 225 has an outer diameter in a range of from 20 mm to 100 mm, from 40 mm to 100 mm, from 60 mm to 100 mm, from 80 mm to 100 mm, from 20 mm to 80 mm, from 40 mm to 80 mm, from 60 mm to 80 mm, from 20 mm to 60 mm, from 40 mm to 60 mm or from 20 mm to 40 mm smaller than the opening diameter of the opening 310 of the processing chamber lid 300.

Referring to FIG. 4, some embodiments include the controller 495 is further configured to be coupled with the vision system 700. In some embodiments, the controller 495 can be coupled with a motor to position the centering ring 650 to a predetermined theta position that is determined by the vision system 700.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed:

1. A method for aligning a processing chamber, the method comprising:
   positioning a centering ring adjacent an opening in a processing chamber lid so that the centering ring is loosely fixed in position, the processing chamber lid having an outside surface and an inside surface, the centering ring positioned in contact with the outside surface and having an inner diameter and an outer diameter, the opening in the processing chamber lid having an opening diameter;
   positioning a vision system on the centering ring;
   determining a concentricity of the centering ring relative to a first support surface of a substrate support positioned adjacent to and spaced from the inside surface of the processing chamber lid using the vision system;
   rotating the substrate support to position a second support surface of the substrate support adjacent to the opening in the processing chamber lid;
   determining a concentricity of the centering ring relative to the second support surface;
   determining an average central position for the centering ring based on the concentricity of the centering ring with the first support surface and the second support surface; and
   adjusting the position of the centering ring to a final position based on the average central position.

2. The method of claim 1, wherein the processing chamber comprises four support surfaces on the substrate support.

3. The method of claim 2, further comprising determining the concentricity of the support ring relative to a third support surface and a fourth support surface.

4. The method of claim 3, wherein determining the average central position for the centering ring is based on the concentricity of the centering ring with the first support surface, the second support surface, the third support surface and the fourth support surface.

5. The method of claim 1, wherein the processing chamber lid comprises more than one opening and the method is performed for each of the openings.

6. The method of claim 5, wherein there are the same number of openings and support surfaces.

7. The method of claim 6, wherein there are four openings in the processing chamber lid and four support surfaces.

8. The method of claim 1, wherein determining the average central position for the centering ring includes a thermal expansion offset.

9. The method of claim 1, further comprising bolting the centering ring in the final position.

10. The method of claim 1, wherein the centering ring has an inner diameter less than or equal to the outer diameter of the opening in the processing chamber lid.

11. The method of claim 1, further comprising removing the vision system; and installing a process station in the opening through the centering ring.

12. The method of claim 10, wherein the process station has an outer diameter in the range of 1 mm to 5 mm smaller than the opening in the processing chamber lid.

13. The method of claim 1, wherein the vision system comprises a laser profilometer.

14. The method of claim 13, wherein the laser profilometer evaluates an inner edge of the centering ring and an outer edge of the substrate support.

15. The method of claim 13, wherein the laser profilometer is connected to the centering ring during measurement.

16. The method of claim 15, wherein the laser profilometer is rotatable on an xy stage to obtain measurements at different angular positions.

17. The method of claim 1, wherein the substrate support has an outer diameter in the range of 50 mm to 80 mm smaller than the opening diameter in the processing chamber lid.

18. A method for aligning a processing chamber, the method comprising:
   positioning a centering ring adjacent an opening in a processing chamber lid so that the centering ring is loosely fixed in position, the processing chamber lid having an outside surface and an inside surface, the centering ring positioned in contact with the outside surface and having an inner diameter and an outer diameter, the opening in the processing chamber lid having an opening diameter;
   positioning a vision system on the centering ring;
   determining a concentricity of the centering ring relative to a first support surface of a substrate support positioned adjacent to and spaced from the inside surface of the processing chamber lid using the vision system;
   rotating the substrate support to position a second support surface of the substrate support adjacent to the opening in the processing chamber lid;
   determining a concentricity of the centering ring relative to the second support surface;
   rotating the substrate support to position a third support surface of the substrate support adjacent to the opening in the processing chamber lid;
   determining a concentricity of the centering ring relative to the third support surface;
   rotating the substrate support to position a fourth support surface of the substrate support adjacent to the opening in the processing chamber lid;

determining a concentricity of the centering ring relative to the fourth support surface;

determining an average central position for the centering ring based on the concentricity of the centering ring with the first support surface, the second support surface, the third support surface and the fourth support surface; and adjusting the position of the centering ring to a final position based on the average central position.

\* \* \* \* \*